(12) United States Patent
Qin et al.

(10) Patent No.: US 12,020,500 B2
(45) Date of Patent: Jun. 25, 2024

(54) DISPLAY PANEL AND DISPLAY DEVICE

(71) Applicant: KUNSHAN GO-VISIONOX OPTO-ELECTRONICS CO., LTD, Jiangsu (CN)

(72) Inventors: Xu Qin, Kunshan (CN); Huan Wang, Kunshan (CN); Lu Zhang, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 106 days.

(21) Appl. No.: 17/519,037

(22) Filed: Nov. 4, 2021

(65) Prior Publication Data

US 2022/0058366 A1  Feb. 24, 2022

Related U.S. Application Data

(63) Continuation of application No. PCT/CN2020/109817, filed on Aug. 18, 2020.

(30) Foreign Application Priority Data

Nov. 29, 2019 (CN) .......................... 201911205659.X

(51) Int. Cl.
*G06V 40/13* (2022.01)
*G09G 3/3233* (2016.01)
(Continued)

(52) U.S. Cl.
CPC ....... *G06V 40/1318* (2022.01); *G09G 3/3233* (2013.01); *H10K 59/65* (2023.02); *G09G 2300/0456* (2013.01); *H01L 27/14678* (2013.01)

(58) Field of Classification Search
CPC ........... G06V 40/1318; G06V 40/1324; G09G 3/3233; G09G 2300/0456;
(Continued)

(56) References Cited

U.S. PATENT DOCUMENTS

2006/0164350 A1\* 7/2006 Kim ..................... G09G 3/3614
  345/87
2010/0007681 A1\* 1/2010 Kubota ................ G09G 3/3233
  345/76
(Continued)

FOREIGN PATENT DOCUMENTS

CN    107122742 A    9/2017
CN    107133613 A    9/2017
(Continued)

OTHER PUBLICATIONS

Supplemental Search Report issued on Jul. 12, 2022, in connection with corresponding Chinese Application No. 2019-11205659; 6 pages including English-language translation.
(Continued)

*Primary Examiner* — Roberto W Flores
(74) *Attorney, Agent, or Firm* — Maier & Maier, PLLC

(57) ABSTRACT

A display panel includes a display module and a fingerprint identification module. The display module includes an array substrate and a plurality of light-emitting units. A light-emitting unit includes a reflecting electrode. The display module includes a plurality of light-transmitting regions disposed on the array substrate. The fingerprint identification module is configured to perform fingerprint identification according to the light which is firstly reflected by a touch body, secondly passes through the light-transmitting regions of the display module, and thirdly hits the fingerprint identification module. The light-transmitting regions of the display module include a plurality of first light-transmitting regions. The area of one first light-transmitting region is
(Continued)

greater than or equal to 2.5% of the area occupied by one pixel unit. In the direction perpendicular to the display panel, a first light-transmitting region is corresponding to an electrical potential connecting point.

19 Claims, 10 Drawing Sheets

(51) Int. Cl.
*H10K 59/65* (2023.01)
*H01L 27/146* (2006.01)

(58) Field of Classification Search
CPC .......... G09G 2300/0426; H10K 59/65; H10K 59/121; H10K 59/10–131; H10K 59/40–70; H01L 27/14678; G06F 3/0412; G06F 3/042–0428
See application file for complete search history.

(56) References Cited

U.S. PATENT DOCUMENTS

| | | | |
|---|---|---|---|
| 2013/0207117 A1* | 8/2013 | An | H10K 59/131 257/40 |
| 2015/0179107 A1* | 6/2015 | Kim | G09G 3/3233 345/82 |
| 2016/0132712 A1 | 5/2016 | Yang et al. | |
| 2018/0183008 A1* | 6/2018 | Song | H10K 59/121 |
| 2019/0114459 A1* | 4/2019 | Ma | G06V 40/1318 |
| 2019/0197282 A1 | 6/2019 | Gong et al. | |
| 2019/0325186 A1* | 10/2019 | Gao | G06V 40/1376 |
| 2019/0393283 A1* | 12/2019 | Lu | H10K 59/65 |
| 2020/0176527 A1* | 6/2020 | An | H10K 59/1216 |
| 2020/0343320 A1* | 10/2020 | Zeng | H10K 59/65 |
| 2021/0409581 A1* | 12/2021 | Hai | G02B 27/30 |

FOREIGN PATENT DOCUMENTS

| | | |
|---|---|---|
| CN | 108520224 A | 9/2018 |
| CN | 108805055 A | 11/2018 |
| CN | 108878488 A | 11/2018 |
| CN | 108920994 A | 11/2018 |
| CN | 110032918 A | 7/2019 |
| CN | 110046611 A | 7/2019 |
| CN | 110061042 A | 7/2019 |
| CN | 110875370 A | 3/2020 |

OTHER PUBLICATIONS

International Search Report issued on Nov. 24, 2020 in corresponding International Application No. PCT/CN2020/109817; 5 pages.
First Office Action issued on Oct. 11, 2021 in corresponding Chinese Application No. 201911205659.X; 11 pages; Machine translation attached.

* cited by examiner

DISPLAY PANEL AND DISPLAY DEVICE

CROSS-REFERENCE TO RELATED APPLICATIONS

This application is a Continuation Application of International Patent Application PCT/CN2020/109817, filed Aug. 18, 2020, which claims priority to Chinese Patent Application No. 201911205659.X filed with the CNIPA on Nov. 29, 2019, the disclosures of which are incorporated herein by reference in their entireties.

TECHNICAL FIELD

Embodiments of the present application relate to the field of display technology, for example, a display panel and a display device.

BACKGROUND

With the continuous development of fingerprint collection technology, electronic devices like smartphones have been able to support the under-screen fingerprint identification function to date. However, affected by screen transmittance, the success rate of image collection and identification is still not able to meet the same requirements for a related fingerprint assembly.

Additionally, the case where the sizes of relatively large openings in a display module are slightly different from the sizes of relatively small openings in the display module may cause abnormal fingerprint capturing, thus affecting the sensitivity and success rate of the fingerprint identification function implemented by the display panel.

SUMMARY

The present application provides a display panel and a display device to increase the transmittance of the display module, raise the light collection amount of the fingerprint identification module, improve the condition of abnormal fingerprint capturing, and thus enhance the sensitivity and success rate of fingerprint identification implemented by the fingerprint identification module.

In a first aspect, embodiments of the present application provide a display panel. The display panel includes a display module and a fingerprint identification module.

The display module includes an array substrate and a plurality of light-emitting units disposed on the array substrate. Each of the light-emitting units includes a reflecting electrode. The array substrate includes a plurality of pixel driving circuits. The reflecting electrode in the light-emitting unit is electrically connected to a corresponding pixel driving circuit at an electrical potential connecting point. The display module includes a plurality of light-transmitting regions disposed on the array substrate.

The fingerprint identification module is disposed on one side of the array substrate facing away from the light-emitting units, and the fingerprint identification module is configured to perform fingerprint identification according to light which is firstly reflected by a touch body, secondly passes through the light-transmitting regions of the display module, and thirdly hits the fingerprint identification module.

The light-transmitting regions of the display module include a plurality of first light-transmitting regions. The area of each of the plurality of first light-transmitting regions is greater than or equal to 2.5% of the area occupied by one pixel unit. The first light-transmitting region is adjacent to the electrical potential connecting point in the direction perpendicular to the display panel.

In a second aspect, embodiments of the present application further provide a display device. The display device includes the display panel described in the first aspect.

Embodiments of the present application provide a display panel and a display device. The display panel includes a display module and a fingerprint identification module. The display module includes an array substrate and a plurality of light-emitting units disposed on the array substrate. The array substrate includes a plurality of pixel driving circuits. The reflecting electrode in a light-emitting unit is electrically connected to a corresponding pixel driving circuit at an electrical potential connecting point. The fingerprint identification module is disposed on one side of the array substrate facing away from the light-emitting units, and the fingerprint identification module is configured to perform fingerprint identification according to the light which is firstly reflected by a touch body, secondly passes through the light-transmitting regions of the display module, and thirdly hits the fingerprint identification module. The light-transmitting regions of the display module include a plurality of first light-transmitting regions. The area of one first light-transmitting region is greater than or equal to 2.5% of the area occupied by one pixel unit. In the direction perpendicular to the display panel, a first light-transmitting region is adjacent to the electrical potential connecting point. This arrangement increases the transmittance of the display module, raises the light collection amount of the fingerprint identification module, improves the condition of abnormal fingerprint capturing, and thus enhances the sensitivity and success rate of fingerprint identification implemented by the fingerprint identification module.

DETAILED DESCRIPTION

Figure 1:
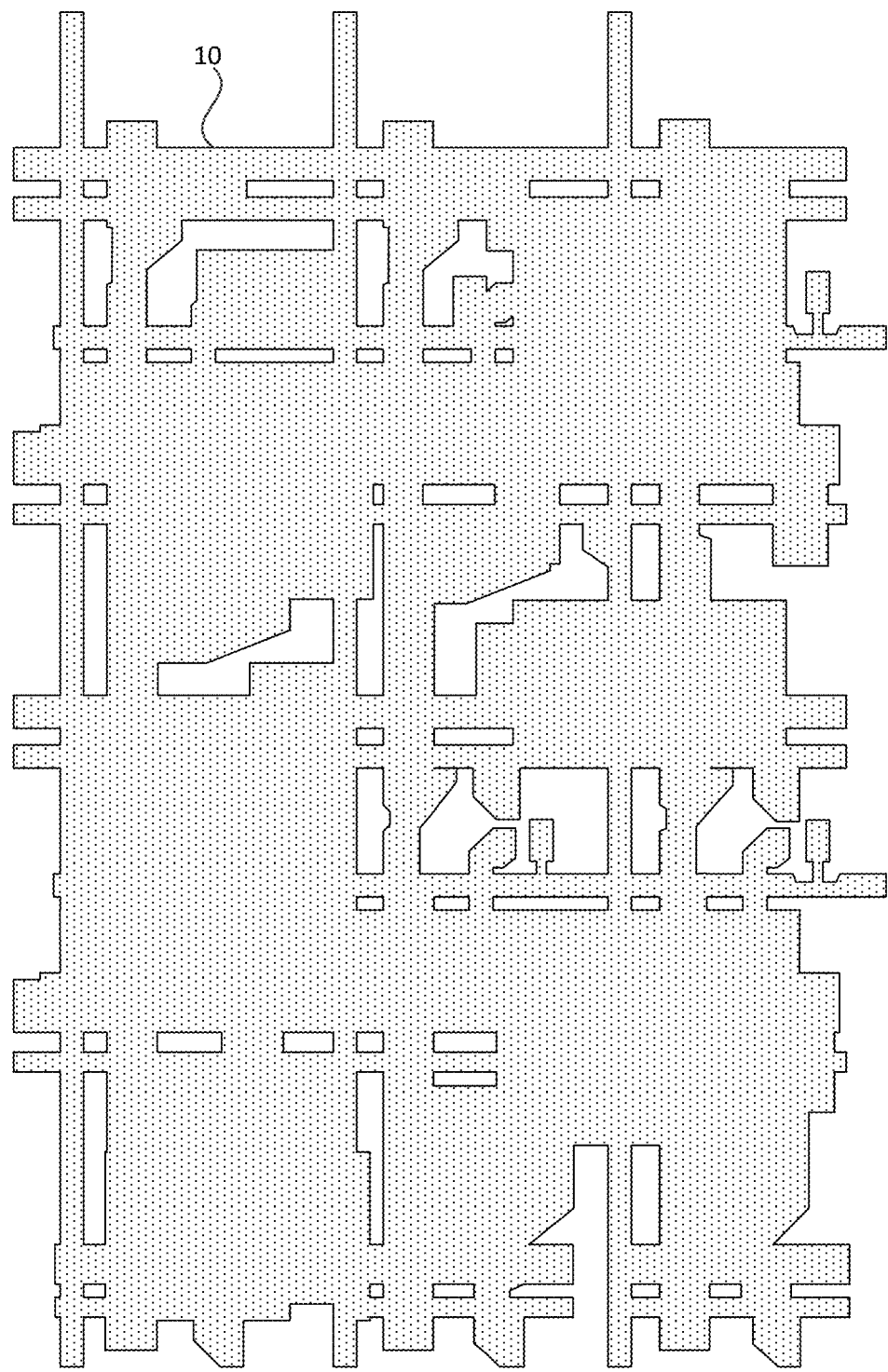
FIG. 1 is a top view illustrating the structure of a display panel in the related art.

As described in the background, in a display panel with the fingerprint identification function, a fingerprint identification module is generally disposed under the display module. The light firstly comes from a light source, secondly reflected by a touch body, thirdly passes through the display module, and fourthly hits the fingerprint identification module under the display module. Accordingly, the fingerprint identification function is implemented by the display panel. The display panel further includes opaque structures like a metal layer. Affected by screen transmittance, the success rate of image collection and identification is still not able to meet the same requirements for a related fingerprint assembly. FIG. 1 is a top view illustrating the structure of another display panel in the related art. Black regions in FIG. 1 are all metal opaque structures 10. Thus in the related art, the areas of light-transmitting regions in the display module are slightly different from each other. That is, the sizes of relatively large light-transmitting openings in the display module are slightly different from the sizes of relatively small light-transmitting openings in the display module. That is, the sizes of openings not provided with black structures in FIG. 1 are similar to each other. In the process of fingerprint image collection, the relatively large light-transmitting openings may generate primary diffraction spots and the relatively small light-transmitting openings may generate secondary diffraction spots. When the sizes of relatively large light-transmitting openings in the display module are slightly different from the sizes of relatively small light-transmitting openings in the display module, the fingerprint identification module may collect the primary diffraction spots and the secondary diffraction spots simultaneously. In the case where the secondary diffraction spots form the reflection superposition of light intensity at the edge of a prism and the secondary light intensity exceeds the primary light intensity, a fingerprint may be captured abnormally. Accordingly, the sensitivity and success rate of the fingerprint identification function implemented by the display panel is enhanced.

In embodiments of the present application, a first light-transmitting region D with a relatively large area is formed in the region adjacent to the position where the reflecting electrode in a light-emitting unit is electrically connected to a corresponding pixel driving circuit. That is, a large opening that can transmit light is formed in the display module. This arrangement enlarges the area of light transmission, increases the transmittance of the display module, raises the light collection amount of the fingerprint identification module, and thus enhances the sensitivity and success rate of fingerprint identification implemented by the fingerprint identification module. Moreover, the arrangement in which the area of one first light-transmitting region is greater than or equal to 2.5% of the area occupied by one pixel unit increases the number of large openings in the display module or increases the sizes of large openings in the display module, thus decreasing the number of small openings in the display module or decreasing the sizes of small openings in the display module and accordingly widening the difference between the sizes of large openings for primary light transmission and the sizes of small openings for auxiliary light transmission. In this case, the condition of abnormal fingerprint capturing is improved, and the sensitivity and success rate of fingerprint identification implemented by the display panel are enhanced. It is to be noted that a reflecting electrode in embodiments of the present application may be an anode or a cathode and is not limited in the present application.

Figure 2:
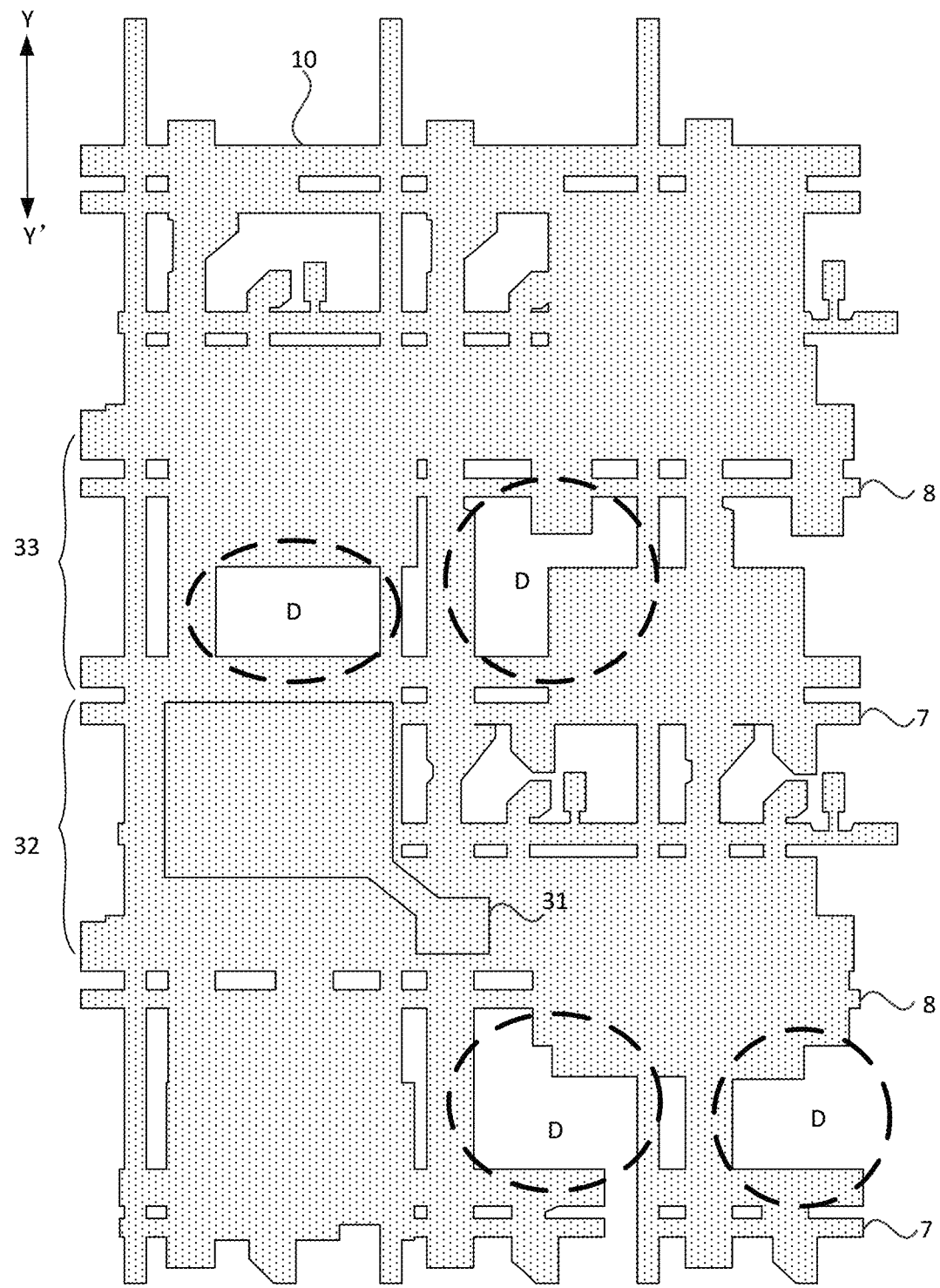
FIG. 2 is a top view illustrating the structure of a display panel according to an embodiment of the present application.
Figure 3:
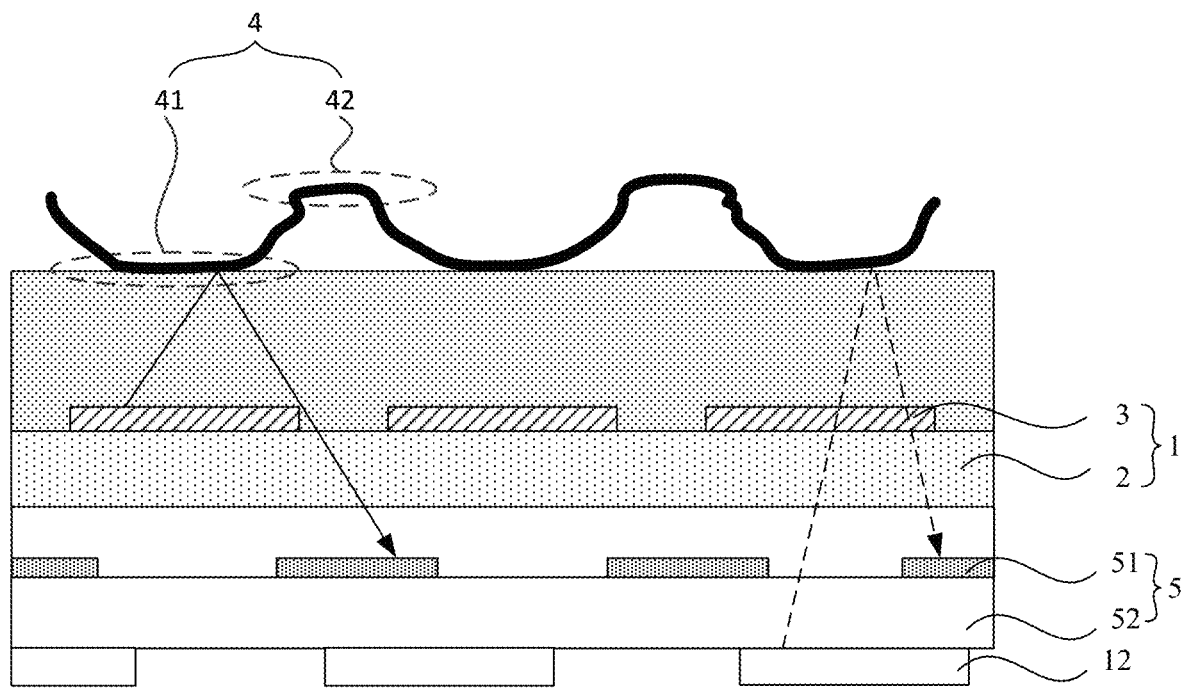
FIG. 3 is a section view illustrating the structure of a display panel according to an embodiment of the present application.
Figure 4:
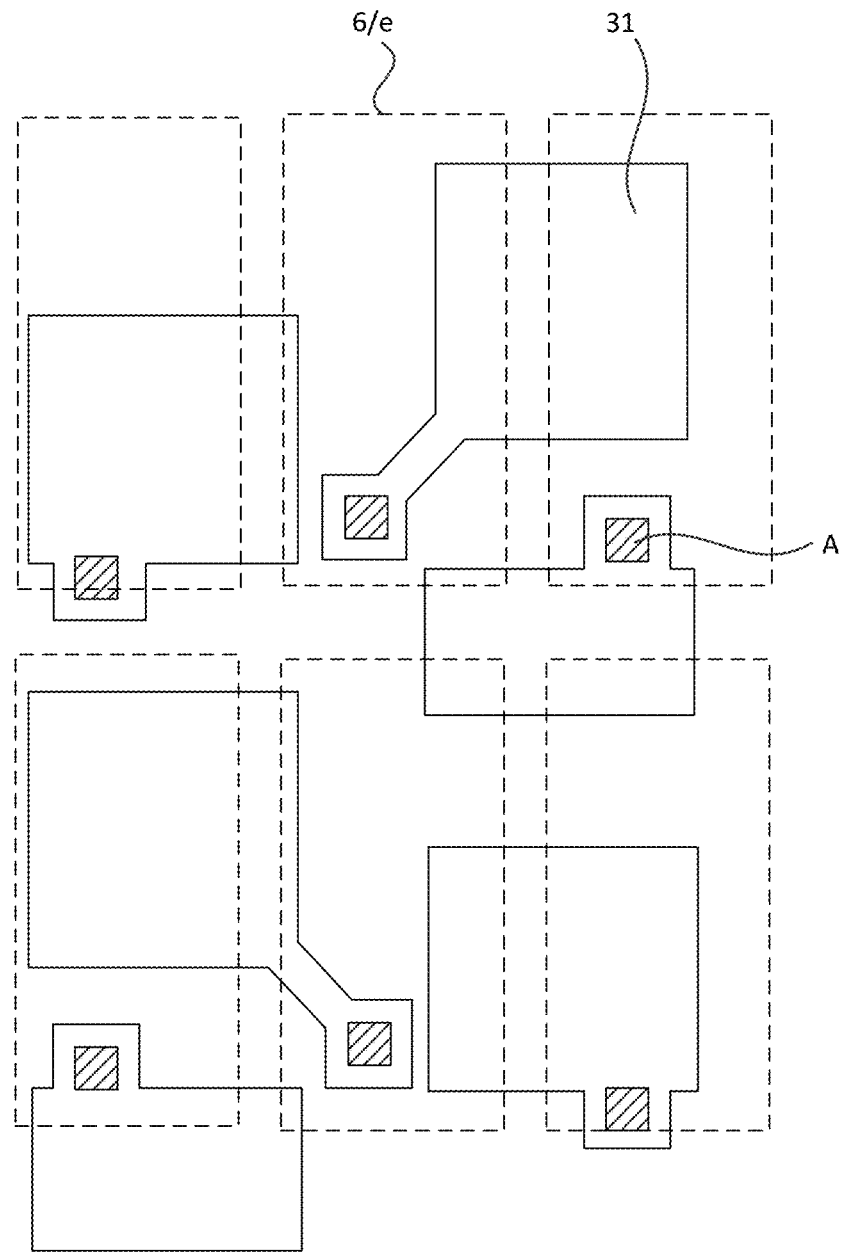
FIG. 4 is a top view illustrating the structure of the reflecting electrode in a light-emitting unit according to an embodiment of the present application.

FIG. 2 is a top view illustrating the structure of a display panel according to an embodiment of the present application. FIG. 3 is a section view illustrating the structure of a display panel according to an embodiment of the present application. FIG. 4 is a top view illustrating the structure of the reflecting electrode in a light-emitting unit according to an embodiment of the present application. Referring to FIGS. 2 to 4, the display panel includes a display module 1 and a fingerprint identification module 5. The display module 1 includes an array substrate 2 and a plurality of light-emitting units 3 disposed on the array substrate 2. A light-emitting unit 3 includes a reflecting electrode 31. The array substrate 2 includes a plurality of pixel driving circuits 6. The reflecting electrode 31 in a light-emitting unit 3 is electrically connected to a corresponding pixel driving circuit 6 at an electrical potential connecting point A. The display module 1 includes a plurality of light-transmitting regions disposed on the array substrate 2. Black regions with relatively large areas in FIG. 2 corresponding to arrangement positions of reflecting electrodes 31 illustrated in FIG. 4 include the reflecting electrodes 31 in the light-emitting units 3. The reflecting electrodes are electrodes having high reflectivity to light.

Exemplarily, the pixel driving circuits 6 are in one-to-one correspondence with the light-emitting units 3. A pixel driving circuit 6 provides a driving current for a corresponding light-emitting unit 3, and the light-emitting unit 3 emits light in response to the driving current. A light-emitting unit 3, for example, may be an organic light-emitting element. A reflecting electrode 31 may be the anode of the organic light-emitting element. The pixel driving circuit 6 is electrically connected to the reflecting electrode 31 in the corresponding light-emitting unit 3 through a via hole. The position of the via hole is the position of the electrical potential connecting point A at which the reflecting electrode 31 in the light-emitting unit 3 is electrically connected to the corresponding pixel driving circuit 6. The pixel driving circuit 6 outputs the driving current to the reflecting electrode 31 in the corresponding light-emitting unit 3 through the electrical potential connecting point A.

Referring to FIGS. 2 to 4, the fingerprint identification module 5 is disposed on a side of the array substrate 2 facing away from the light-emitting units 3. In the display module 1, regions not blocked by metal opaque structures 10 are the light-transmitting regions of the display module 1. The black regions in FIG. 2 are all metal opaque structures 10. The fingerprint identification module 5 is configured to perform fingerprint identification according to light which is firstly reflected by a touch body 4, secondly passes through the light-transmitting regions of the display module 1, and thirdly hits the fingerprint identification module 5.

Exemplarily, the touch body 4 is generally a finger. The fingerprint is composed of a series of ridges 41 and valleys 42 on a skin surface of the fingertip. The distance from a ridge 41 to the fingerprint identification module 5 is different from the distance from a valley 42 to the fingerprint identification module 5. Thus a light ray that reflects off the ridge 41 and hits the fingerprint identification module 5 is different from a light ray that reflects off the valley 42 and hits the fingerprint identification module 5 in intensity. In this case, the magnitude of an electrical current signal converted from the reflected light ray formed at the ridge 41 is different from the magnitude of an electrical current signal converted from the reflected light ray formed at the valley 42. Accordingly, fingerprint identification may be performed according to the magnitudes of electrical current signals. It is to be noted that the touch body 4 may also be, for example, a palm of a hand. That is, functions of detection and identification may also be implemented by using the palm print.

Referring to FIGS. 2 to 4, the light-transmitting regions of the display module 1 include a plurality of first light-transmitting regions D. The area of one first light-transmitting region D is greater than or equal to 2.5% of the area occupied by one pixel unit. In the direction perpendicular to the display panel, a first light-transmitting region D is adjacent to an electrical potential connecting point A.

Exemplarily, one pixel unit includes a light-emitting unit 3 and a pixel driving circuit 6 corresponding to the light-emitting unit 3. The area occupied by one pixel unit includes the vertical projection area of the reflecting electrode 31 in the light-emitting unit 3 in the direction perpendicular to the display panel and the vertical projection area of the transistors and capacitor structure in the pixel driving circuit 6 in the direction perpendicular to the display panel. Only one of the areas of regions whose vertical projections are overlapped is calculated. For example, the arrangement in which the reflecting electrode 31 in the light-emitting unit 3 adjacent to the preceding electrical potential connecting point A and a partial structure in the pixel driving circuit 6 adjacent to the preceding electrical potential connecting point A are moved increases the overlapped area between the reflecting electrode 31 in the light-emitting unit 3 and the partial structure in the pixel driving circuit 6. Accordingly, the area of one first light-transmitting region D is greater than or equal to 2.5% of the area occupied by one pixel unit. Moreover, in the direction perpendicular to the display panel, a first light-transmitting region D is adjacent to the electrical potential connecting point A at which the reflecting electrode 31 in the light-emitting unit 3 and the pixel driving circuit 6 corresponding to the light-emitting unit 3. With this arrangement, the first light-transmitting region D with a relatively large area in the display module 1 is formed in the region adjacent to the position where the reflecting electrode 31 in the light-emitting unit 3 is electrically connected to the corresponding pixel driving circuit 6. That is, a large opening that can transmit light is formed in the display module 1. This arrangement enlarges the area of light transmission, increases the transmittance of the display module 1, raises the light collection amount of the fingerprint identification module 5, and thus enhances the sensitivity and success rate of fingerprint identification implemented by the fingerprint identification module 5.

Referring to FIGS. 2 to 4, in embodiments of the present application, the arrangement in which the area of one first light-transmitting region D is greater than or equal to 2.5% of the area occupied by one pixel unit increases the number of large openings in the display module 1 or increases the sizes of large openings in the display module 1, thus decreasing the number of small openings in the display module 1 (small openings are merged into large openings so as to increase the number of large openings and decrease the number of small openings) or decreasing the sizes of small openings in the display module 1. A small opening herein may be defined as an opening whose area is less than 35% of the area of the largest opening. Alternatively, exemplarily, in the case where the opening is rectangular or parallelogrammatic, a hole whose minimum value of the distance between opposite sides is less than 1.5 μm is defined as a slit in the display module 1. The slit is disadvantageous to image collection. In embodiments of the present application, the arrangement in which the area of one first light-transmitting region D is greater than or equal to 2.5% of the area occupied by one pixel unit widens the difference between the sizes of large openings for primary light transmission and the sizes of small openings for auxiliary light transmission. Thus this arrangement improves abnormal fingerprint capturing and enhances the sensitivity and success rate of the fingerprint identification function implemented by the display panel. In the related art, the fingerprint identification module 5 may collect primary diffraction spots and secondary diffraction spots simultaneously due to a slight difference between the sizes of large openings in the display module 1 and the sizes of small openings in the display module 1. In the case where the secondary diffraction spots form the reflection superposition of light intensity at the edge of a prism and the secondary light intensity exceeds the primary light intensity, a fingerprint may be captured abnormally.

In an embodiment, referring to FIGS. 2 to 4, the array substrate 2 is provided with one scanning signal line 7 and one light-emitting signal line 8 which are corresponding to each row of the light-emitting units 3. In the column direction YY' in which the light-emitting units 3 are arranged, a first light-transmitting region D is disposed between the scanning signal line 7 and the light-emitting signal line 8 which are closest to each other and corresponding to two adjacent rows of the light-emitting units 3, for example, in FIG. 2, a first row of the light-emitting units 33 and a second row of the light-emitting units 32. In FIG. 2, lines are repeated once to correspond to a row of the light-emitting units 3. For example, every three transverse lines correspond to a row of the light-emitting units 3. The three lines from top to bottom are a scanning signal line, a reference signal line, and a light-emitting signal line in sequence.

Figure 5:
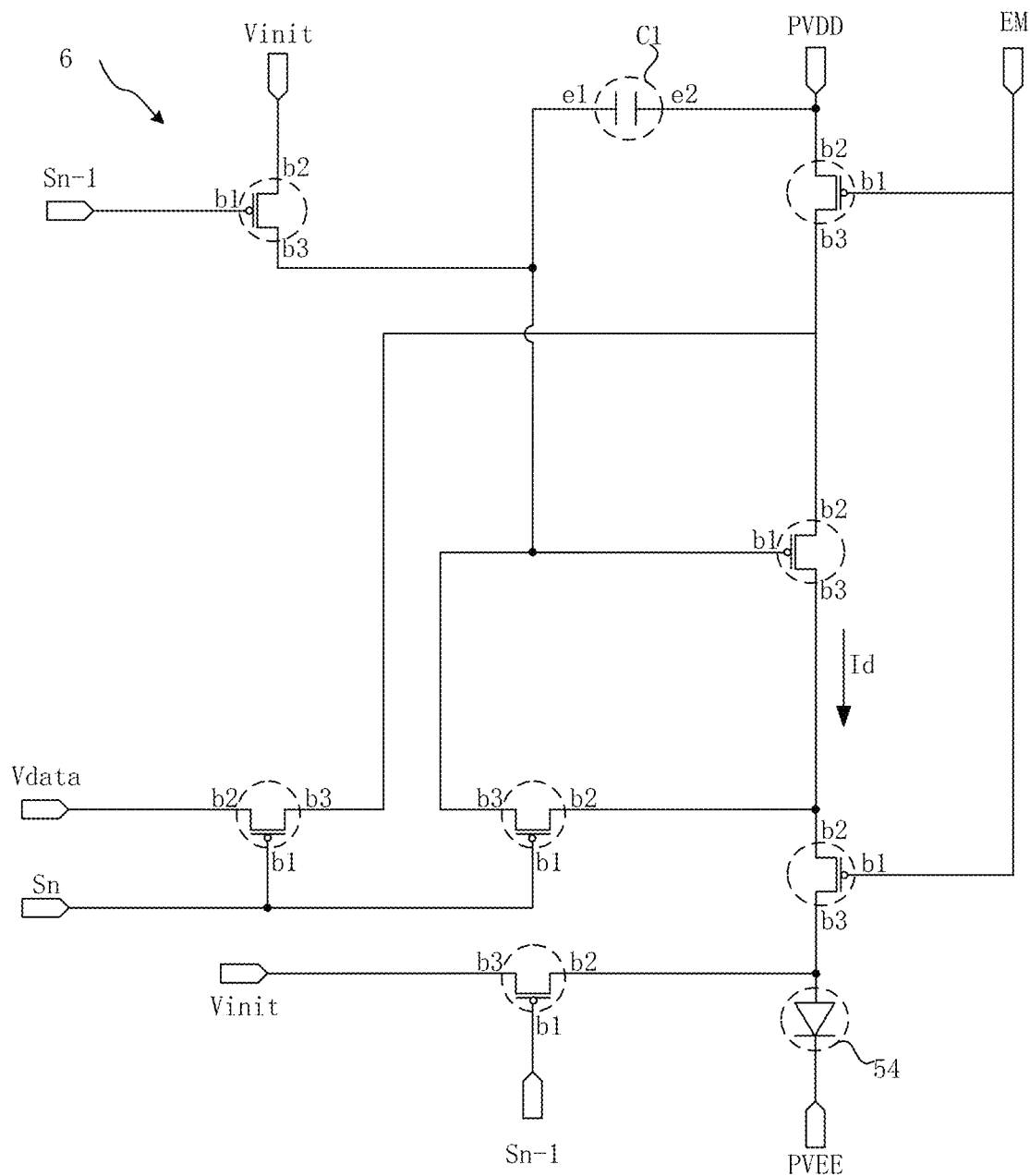
FIG. 5 is a diagram illustrating the structure of a pixel driving circuit according to an embodiment of the present application.

FIG. 5 is a diagram illustrating the structure of a pixel driving circuit according to an embodiment of the present disclosure. Referring to FIGS. 2 to 4 and FIG. 5, light-emitting units 3 are in one-to-one correspondence with the pixel driving circuits 6. A pixel driving circuit 6, for example, may be a pixel driving circuit 6 of 7T1C illustrated in FIG. 5. That is, the pixel driving circuit 6 includes seven transistors and one capacitor structure. The operating principle of the pixel driving circuit 6 of 7T1C is well known to those skilled in the art and is not repeated herein.

A pixel driving circuit 6 of 7T1C is connected with a scanning signal Sn and a scanning signal Sn−1 in two adjacent rows and is connected with a light-emitting signal EM in the row where the pixel driving circuit 6 is located. The same node of each row of the pixel driving circuits 6 is connected with the same scanning signal line 7 and the same light-emitting signal line 8. That is, the array substrate 2 is provided with one scanning signal line 7 and one light-emitting signal line 8 which are corresponding to each row of the light-emitting units 3. It is to be noted that the scanning signals Sn and Sn−1 are identical signals from the same scanning signal line 7. Accordingly, the scanning signals Sn and Sn−1 corresponding to each row of the light-emitting units 3 in the array substrate 2 are both from the same scanning signal line 7 corresponding to each row of the light-emitting units 3 in the array substrate 2. In the column direction YY' in which the light-emitting units are arranged, a first light-transmitting region D may be disposed between the scanning signal line 7 and the light-emitting signal line 8 which are closest to each other and corresponding to two adjacent rows of the light-emitting units 3. Exemplarily, as shown in FIG. 2, the light-emitting signal line 8 corresponding to each row of the light-emitting units 3 in the array substrate 2 may be disposed beneath the scanning signal line 7 corresponding to each row of the light-emitting units 3. Accordingly, the first light-emitting region D is disposed between the light-emitting signal line 8 corresponding to a row of the light-emitting units 33 in the array substrate 2 and the scanning signal line 7 corresponding to the next row of the light-emitting units 32.

Referring to FIGS. 2 to 4 and FIG. 5, a capacitor structure C1 with a relatively large area is disposed between the scanning signal line 7 and the light-emitting signal line 8 that corresponding to the same row of the light-emitting units 3 in the array substrate 2. With this arrangement, a large opening is difficult to form between the scanning signal line 7 and the light-emitting signal line 8 that corresponding to the same row of the light-emitting units 3 in the array substrate 2. That is, a light-transmitting region with a relatively large area is difficult to form in the space between the scanning signal line 7 and the light-emitting signal line 8 that corresponding to the same row of the light-emitting units 3 in the array substrate 2. In embodiments of the present application, in the column direction YY' in which the light-emitting units are arranged, a first light-transmitting region D is disposed between the scanning signal line 7 and the light-emitting signal line 8 which are closest to each other and corresponding to two adjacent rows of the light-emitting units 3. No capacitor structure with a relatively large area is disposed in the region between the light-emitting signal line 8 and the scanning signal line 7 which are closest to each other and corresponding to two adjacent rows of the light-emitting units 3 in the array substrate 2. On one hand, this arrangement meets the wiring requirements in the array substrate 2; on the other hand, this arrangement forms a first light-transmitting region D with a relatively large area between the scanning signal line 7 and the light-emitting signal line 8 which are closest to each other and corresponding to two adjacent rows of the light-emitting units 3 without being limited by circuit configuration, thus reducing the difficulty in forming the first light-transmitting region D with a relatively large area in the display module 1.

It is to be noted that FIG. 5 only exemplarily illustrates the example of pixel driving circuits 6 of 7T1C. The numbers of transistors and capacitors in a pixel driving circuit 6 are not limited in embodiments of the present application.

In an embodiment, referring to FIGS. 2 to 4 and FIG. 5, the scanning signal line 7 and the light-emitting signal line 8 which are closest to each other may be disposed in the same layer. That is, the preceding scanning signal line 7 and the preceding light-emitting signal line 8 are disposed in the same layer in the array substrate 2, and for example, may be manufactured in the same layer with the gates of transistors in the pixel driving circuits 6 in the array substrate 2. Accordingly, the minimum distance between the scanning signal line 7 and the light-emitting signal line 8 which are closest to each other and corresponding to two adjacent rows of the light-emitting units 3 may be greater than or equal to 3 μm and less than or equal to 4 μm. Moreover, factors need to be considered, including whether the preceding scanning signal line and the preceding light-emitting signal line disposed in the same layer interfere with or short-circuit surrounding lines, whether signal crosstalk is generated between the preceding scanning signal line and the preceding light-emitting signal line disposed in the same layer, and whether the preceding scanning signal line and the preceding light-emitting signal line are wide enough to avoid line breakage. For example, factors to be satisfied include that the light-emitting signal line 8 in the pixel driving circuit 6 where the light-emitting signal line 8 is located does not interfere with the capacitor structure or transistors disposed above the light-emitting signal line 8 and that the scanning signal line 7 in the pixel driving circuit 6 where the scanning signal line 7 is located does not short-circuit the elements and lines disposed beneath the scanning signal line 7. Under the premise of considering such factors, the distance between the scanning signal line 7 and the light-emitting signal line 8 which are closest to each other and corresponding to two adjacent rows of the light-emitting units 3 is increased to the largest degree so that the difficulty in forming the first light-transmitting region D with a relatively large area between the scanning signal line 7 and the light-emitting signal line 8 which are closest to each other and corresponding to two adjacent rows of the light-emitting units 3.

In an embodiment, referring to FIGS. 2 to 4 and FIG. 5, the scanning signal line 7 and the light-emitting signal line 8 which are closest to each other may further be disposed in different layers. That is, the preceding scanning signal line 7 and the preceding light-emitting signal line 8 are disposed in different layers in the array substrate 2. Accordingly, the scanning signal line 7 and the light-emitting signal line 8 which are closest to each other and corresponding to two adjacent rows of light-emitting units 3 have the minimum distance between an orthographic projection of the scanning signal line 7 in the direction perpendicular to the display panel and an orthographic projection of the light-emitting signal line 8 in the direction perpendicular to the display panel, where the minimum distance is greater than or equal to 1.5 μm and less than or equal to 2 μm. Similarly, factors need to be considered, including whether the preceding scanning signal line and the preceding light-emitting signal line disposed in the same layer interfere with or short-circuit surrounding lines, whether signal crosstalk is generated between the preceding scanning signal line and the preceding light-emitting signal line disposed in the same layer, and whether the preceding scanning signal line and the preceding light-emitting signal line are wide enough to avoid line breakage. For example, factors to be satisfied include that the light-emitting signal line 8 in the pixel driving circuit 6 where the light-emitting signal line 8 is located does not interfere with the capacitor structure or transistors disposed above the light-emitting signal line 8 and that the scanning signal line 7 in the pixel driving circuit 6 where the scanning signal line 7 is located does not short-circuit the elements and lines disposed beneath the scanning signal line 7. Under the premise of considering such factors, the distance between the scanning signal line 7 and the light-emitting signal line 8 which are closest to each other and corresponding to two adjacent rows of the light-emitting units 3 is increased to the largest degree so as to reduce the difficulty in forming the first light-transmitting region D with a relatively large area between the scanning signal line 7 and the light-emitting signal line 8 which are closest to each other and corresponding to two adjacent rows of the light-emitting units 3.

In an embodiment, as shown in FIG. 4, three rows and two columns of light-emitting units are corresponding to two rows and three columns of pixel driving circuits 6. That is, three rows and two columns of reflecting electrodes 31 are corresponding to two rows and three columns of pixel driving circuits 6. Distribution regions e of the pixel driving circuits 6 are spaced a preset distance apart. Referring to FIGS. 2 to 4 and FIG. 5, the arrangement in which three rows and two columns of light-emitting units are corresponding to two rows and three columns of pixel driving circuits 6 indicates that the regions of three rows and two columns of light-emitting units 3 are provided with two rows and three columns of pixel driving circuits 6. The distribution regions of the pixel driving circuits 6 are mainly inside regions e determined by dashed lines in FIG. 4. The distribution regions e of the pixel driving circuits 6 are distribution regions of the transistors and capacitor structures in the pixel driving circuits 6.

Figure 6:
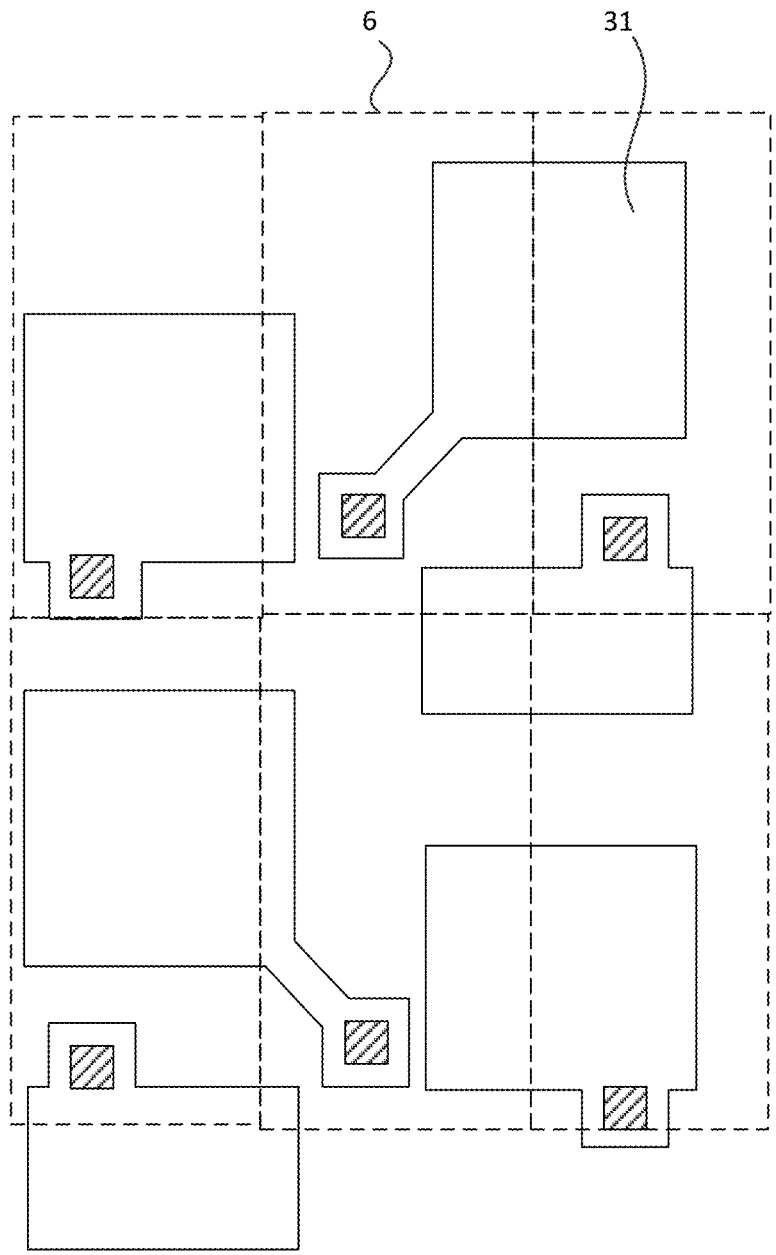
FIG. 6 is a top view illustrating the structure of another display panel in the related art.

FIG. 6 is a top view illustrating the structure of another display panel in the related art. As shown in FIG. 6, three rows and two columns of light-emitting units are corresponding to two rows and three columns of pixel driving circuits 6. The area occupied by reflecting electrodes 31 in the three rows and two columns of light-emitting units is the same as the area occupied by the two rows and three columns of pixel driving circuits 6. For example, as for a display panel having about 400 pixels per inch (PPI), the area occupied by reflecting electrodes 31 in three rows and two columns of light-emitting units equals approximately that 94.5×126; the area occupied by two rows and three columns of pixel driving circuits 6 is also approximately that 94.5×126. In this case, almost all regions in the display module are occupied by the reflecting electrodes 31 in the light-emitting units and the light-blocking structures in the pixel driving circuits 6, making a light-transmitting region with a relatively large area difficult to be formed in the display module.

Referring to FIGS. 2 to 4 and FIG. 5, in embodiments of the present application, the arrangement in which three rows and two columns of light-emitting units 3 are corresponding to two rows and three columns of pixel driving circuits 6 and in which distribution regions e of the pixel driving circuits 6 are spaced a preset distance apart helps reduce the area occupied by the pixel driving circuits 6. That is, the distribution of the transistors and capacitor structures in the pixel driving circuits 6 are more compact. Alternatively, overlapped areas between the pixel driving circuits 6 and the reflecting electrodes 31 in the light-emitting units 3 are increased so that the distribution regions e of the pixel driving circuits 6 are spaced a preset distance apart. This provides an arrangement space for forming the first light-transmitting region D with a relatively large area in the display module 1 and reduces the difficulty in forming the first light-transmitting region D with a relatively large area between the scanning signal line 7 and the light-emitting signal line 8 which are closest to each other and corresponding to two adjacent rows of the light-emitting units 3.

Figure 7:
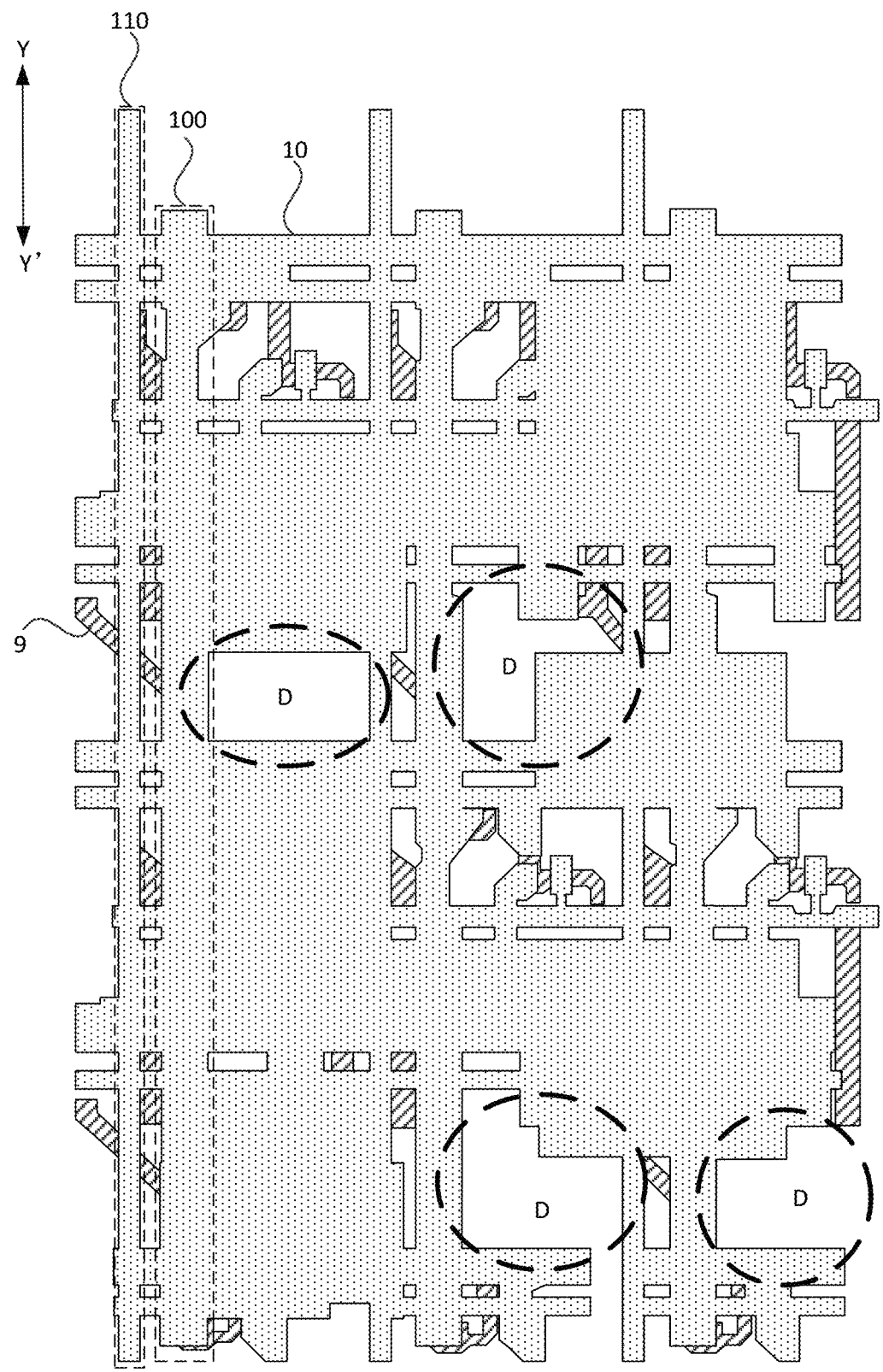
FIG. 7 is a top view illustrating the structure of another display panel according to an embodiment of the present application.
Figure 8:
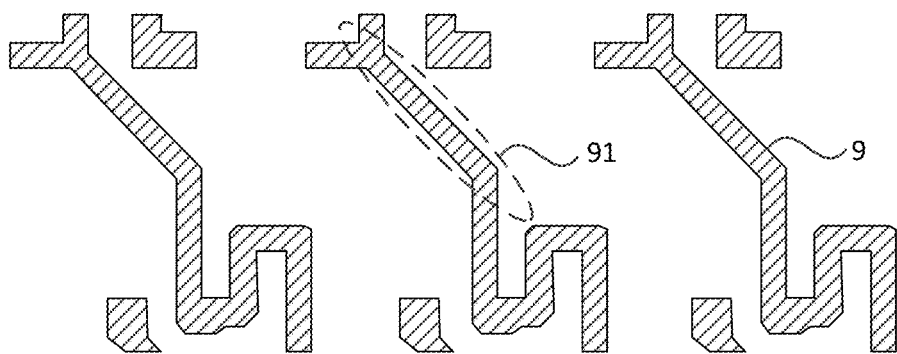
FIG. 8 is a top view illustrating the structure of a reference signal line according to an embodiment of the present application.

FIG. 7 is a top view illustrating the structure of another display panel according to an embodiment of the present application. As shown in FIG. 7, on the basis of preceding embodiments, the array substrate 2 is further provided with at least one reference signal line 9. FIG. 8 is a top view illustrating the structure of a reference signal line according to an embodiment of the present application. Referring to FIGS. 2 to 4 and FIGS. 5 to 8, the pixel driving circuits 6 corresponding to the light-emitting units 3 disposed in two adjacent rows and two adjacent columns share one reference signal line 9.

Figure 9:
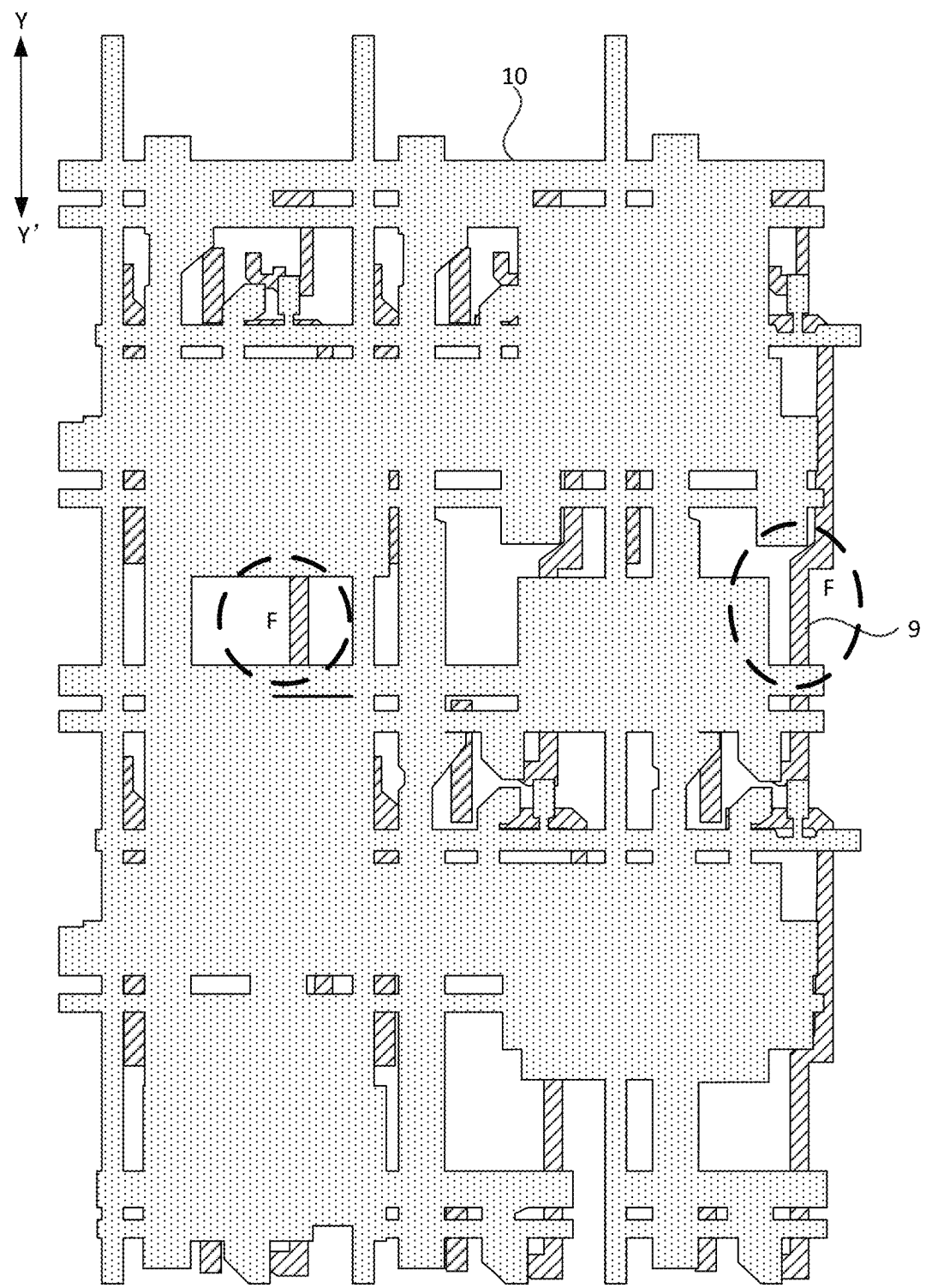
FIG. 9 is a top view illustrating the structure of a display panel in the related art.

FIG. 9 is a top view illustrating the structure of a display panel in the related art. As shown in FIG. 9, pixel driving circuits corresponding to light-emitting units disposed in the same column share one reference signal line 9. That is, the reference signal line 9 extends in the column direction YY' of the light-emitting units 3. In this case, the reference signal line 9 inevitably exists in the region F between the scanning signal line 7 and the light-emitting signal line 8 which are closest to each other in the light-emitting units in two adjacent rows in the display module. As an opaque structure, the reference signal line 9 affects forming a light-transmitting region with a relatively large area in the display panel.

Referring to FIGS. 2 to 4 and FIGS. 5 to 8, in embodiments of the present application, the pixel driving circuits 6 corresponding to the light-emitting units 3 disposed in two adjacent rows and two adjacent columns share one reference signal line 9. That is, two adjacent rows and two adjacent columns of the pixel driving circuits 6 are connected to the reference signal line 9 with displacement so that the reference signal line 9 forms a plurality of oblique lines 91. By virtue of adjusting the inclination angle of an oblique line 91 of the reference signal line 9, the arrangement of the reference signal line 9 helps avoid the region between the scanning signal line 7 and the light-emitting signal line 8 which are closest to each other and corresponding to two adjacent rows of the light-emitting units 3 in the display module 1. This facilitates forming the first light-transmitting region D with a relatively large area between the scanning signal line 7 and the light-emitting signal line 8 which are closest to each other and corresponding to two adjacent rows of the light-emitting units 3 and reduces the difficulty in forming the first light-transmitting region D with a relatively large area between the scanning signal line 7 and the light-emitting signal line 8 which are closest to each other and corresponding to two adjacent rows of the light-emitting units 3.

In an embodiment, referring to FIGS. 2 to 4 and FIGS. 5 to 8, the array substrate further includes a first power signal line 100 and a data signal line 110 each extending in the column direction YY' in which the light-emitting units 3 are arranged. In the direction perpendicular to the display panel, the reference signal line 9 overlaps at least one of the first power signal line 100 or the data signal line 110. It is to be noted that the overlapping between two signal lines indicates that the two signal lines are disposed in different layers. Exemplarily, in the direction perpendicular to the display panel, the reference signal line 9 may overlap the first power signal line 100 (in this case, the reference signal line 9 and the first power signal line 100 are disposed in different layers). Alternatively, the reference signal line 9 may overlap the data signal line 110 (in this case, the reference signal line 9 and the data signal line 110 are disposed in different layers). Alternatively, the reference signal line 9 may overlap both the first power signal line 100 and the data signal line 110 (in this case, the reference signal line 9 and the first power signal line 100 are disposed in different layers; moreover, the reference signal line 9 and the data signal line 110 are disposed in different layers). Accordingly, the overlapped area between the reference signal line 9 and the light-blocking first power signal line 100 or the light-blocking data signal line 110 is widened, which reduces the light blocking area occupied by the pixel driving circuits 6 is reduced and thus facilitates forming the first light-transmitting region D with a relatively large area in the display module 1.

In an embodiment, referring to FIGS. 2 and 3, the fingerprint identification module 5 includes a plurality of fingerprint identification units 51. A fingerprint identification unit 51 includes a photosensitive region. In the direction perpendicular to the display panel, the photosensitive region covers a corresponding first light-transmitting region D. Exemplarily, a fingerprint identification unit 51 may be a fingerprint identification sensor. A fingerprint identification unit 51 may include a photosensitive diode for converting a light ray that reflects off the touch body 4 into an electrical current signal. The photosensitive diode is provided with a positive-intrinsic-negative (PIN) junction. The PIN junction has the features of photosensitivity and unilateral conductivity. In the absence of illumination, the PIN junction has a small saturated reverse leakage current, that is, a dark current. In this case, the photosensitive diode is turned off.

Under illumination, the saturated reverse leakage current of the PIN junction increases greatly to form a light current. The light current varies with the intensity of incident light. In this case, the photosensitive diode is the photosensitive module of a fingerprint identification unit 51. The region where the photosensitive diode is located may be arranged as the photosensitive region of the fingerprint identification unit 51. In the direction perpendicular to the display panel, the photosensitive region is configured to cover a corresponding first light-transmitting region D. With this arrangement, light which is firstly reflected by the touch body 4, secondly passes through the light-transmitting regions of the display module 1, and thirdly returns can hit the photosensitive regions of the fingerprint identification units 51 accurately, which raises the light collection amount of the fingerprint identification units 51 and thus enhances the sensitivity and success rate in the fingerprint identification process.

In an embodiment, as shown in FIG. 3, the light-emitting units 3 provide light for the fingerprint identification module 5. The fingerprint identification module 5 is configured to perform fingerprint identification according to light which firstly comes from the light-emitting units 3, is secondly reflected by the touch body 4, thirdly passes through the light-transmitting regions of the display module 1, and fourthly hits the fingerprint identification module 5.

Exemplarily, the light-emitting units 3 may provide light for the fingerprint identification module 5. The fingerprint identification module 5 is configured to perform fingerprint identification according to light which firstly comes from the light-emitting units 3, is secondly reflected by the touch body 4, thirdly passes through the light-transmitting regions of the display module 1, and fourthly hits the fingerprint identification module 5. The display panel may be an organic light-emitting display panel. A light-emitting unit 3 may be an organic light-emitting element. The fingerprint identification module 5 may perform fingerprint identification according to light which firstly comes from organic light-emitting elements, is secondly reflected by the touch body 4, and thirdly reaches the fingerprint identification module 5, for example, the light denoted by a solid line in FIG. 3. It is to be noted that relative positions of the organic light-emitting elements and the fingerprint identification units 51 are exemplarily provided in FIG. 3 and not limited in the embodiments of the present disclosure as long as light which comes from the organic light-emitting elements can be reflected by the touch body 4 and reach the fingerprint identification units 51.

In an embodiment, as shown in FIG. 3, the fingerprint identification module 5 includes a substrate 52, a plurality of fingerprint identification units 51 disposed on the substrate 52, and at least one fingerprint identification light source 12 disposed on a side of the substrate 52 facing away from the fingerprint identification units 51. The light emitted from a fingerprint identification light source 12 hits the touch body 4 by passing through a gap between two adjacent fingerprint identification units 51. The fingerprint identification units 51 are configured to perform fingerprint identification according to light which firstly comes from the fingerprint identification light sources 12, is secondly reflected off the touch body 4, thirdly passes through the light-transmitting regions of the display module 1, and fourthly hits the fingerprint identification module 5.

Exemplarily, the fingerprint identification light sources 12 are disposed on a side of the substrate 52 facing away from the fingerprint identification units 51. The fingerprint identification units 51 can perform fingerprint identification according to light which firstly comes from the fingerprint identification light sources 12, is secondly reflected off the touch body 4, and thirdly reaches the fingerprint identification units 51, for example, the light denoted by a solid line in FIG. 3. The light emitted from a fingerprint identification light source 12 hits the touch body 4 by passing through a gap between two adjacent fingerprint identification units 51.

It is to be noted that the positions of the fingerprint identification light sources 12 are not limited in embodiments of the present application as long as light which comes from the fingerprint identification light sources 12 can be reflected by the touch body 4 and reach the fingerprint identification units 51. Moreover, in FIG. 3, the solid line and the dashed line only exemplarily illustrate a certain light ray coming from an organic light-emitting structure and a certain light ray coming from a fingerprint identification light source 12. The light which comes from the organic light-emitting structures and the fingerprint identification light sources 12 may be divergent.

Figure 10:
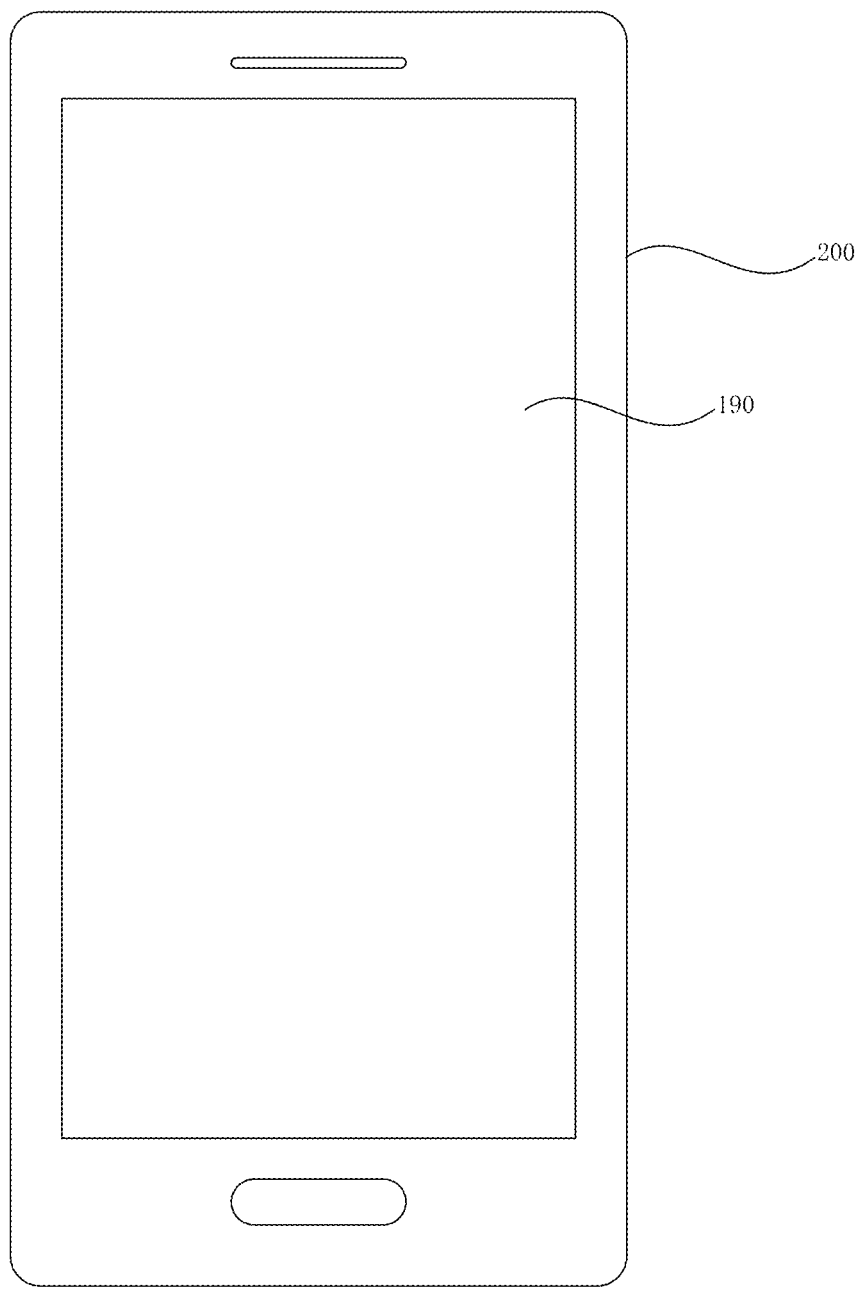
FIG. 10 is a top view illustrating the structure of a display device according to an embodiment of the present application.

Embodiments of the present application further provide a display device. FIG. 10 is a top view illustrating the structure of a display device according to an embodiment of the present application. As shown in FIG. 10, a display device 200 includes a display panel 190 provided in preceding embodiments. Exemplarily, the display device 200 may be, for example, an organic light-emitting diode (OLED) display device and a micro light-emitting diode (Micro LED) display device. The display device may include a terminal device, for example, a smartphone and a computer.

What is claimed is:

1. A display panel, comprising:
   a display module comprising an array substrate and a plurality of light-emitting units disposed on the array substrate, wherein each of the light-emitting units comprises a reflecting electrode, the reflecting electrode having a reflectivity to light, the array substrate comprises a plurality of pixel driving circuits, the reflecting electrode in the light-emitting unit is electrically connected to a corresponding pixel driving circuit at an electrical potential connecting point, and the display module comprises a plurality of light-transmitting regions disposed on the array substrate; and
   a fingerprint identification module disposed on one side of the array substrate facing away from the plurality of light-emitting units, the fingerprint identification module comprising a substrate, wherein the substrate comprises a top side and a bottom side, the fingerprint identification module is on the top side and a plurality of fingerprint light-emitting units are on the bottom side, and the fingerprint identification module is configured to perform fingerprint identification according to light which is firstly reflected by a touch body, secondly passes through the plurality of light-transmitting regions of the display module, and thirdly hits the fingerprint identification module,
   wherein each of the plurality of light transmitting regions comprise (1) a plurality of large openings defining a plurality of first light-transmitting regions and (2) a plurality of small openings, such that the plurality of small openings each have an area which is less than 35% of an area of a largest of the plurality of large openings,
   wherein the first light-transmitting regions are formed adjacent to, when viewed from a direction perpendicular to the display panel, an electrical potential connecting point between the reflecting electrode and a corresponding pixel-driving circuit;

wherein an area of each of the plurality of first light-transmitting regions is greater than or equal to 2.5% of an area occupied by one pixel unit; and the area occupied by the one pixel unit includes a vertical projection, in the direction perpendicular to the display panel, of an area of the reflecting electrode and a vertical projection, in the direction perpendicular to the display panel, of an area of an area of transistors and capacitors in a corresponding pixel driving circuit, wherein the array substrate is provided with one scanning signal line and one light-emitting signal line which are corresponding to each row of light-emitting units, wherein groupings of six light-emitting units are arranged in three rows and two columns, wherein for each row, areas of two light-emitting units overlap in a first direction, and wherein for each column, areas of three light-emitting units overlap in a second direction orthogonal to the first direction, wherein those six pixel driving circuits corresponding to each grouping of six light-emitting units are arranged in two rows and three columns, and wherein distribution regions of the pixel driving circuits are spaced apart by a preset distance.

2. The display panel according to claim 1, wherein in a column direction in which the plurality of light-emitting units are arranged, the first light-transmitting region is disposed between the scanning signal line and the light-emitting signal line which are closest to each other and corresponding to two adjacent rows of light-emitting units.

3. The display panel according to claim 2, wherein the scanning signal line and the light-emitting signal line which are closest to each other are disposed in a same layer and a minimum distance between the scanning signal line and the light-emitting signal line which are closest to each other is greater than or equal to 3 μm and less than or equal to 4 μm.

4. The display panel according to claim 3, wherein the scanning signal line and the light-emitting signal line which are closest to each other are disposed in a same layer with gates of transistors in the plurality of pixel driving circuits.

5. The display panel according to claim 2, wherein the scanning signal line and the light-emitting signal line which are closest to each other are disposed in different layers and have a minimum distance between an orthographic projection of the scanning signal line in the direction perpendicular to the display panel and an orthographic projection of the light-emitting signal line in the direction perpendicular to the display panel, the minimum distance is greater than or equal to 1.5 μm and less than or equal to 2 μm.

6. The display panel according to claim 1, wherein the array substrate is provided with at least one reference signal line; and pixel driving circuits corresponding to the light-emitting units disposed in two adjacent rows and two adjacent columns share one reference signal line.

7. The display panel according to claim 6, wherein the array substrate further comprises a first power signal line and a data signal line each extending in a column direction in which the plurality of light-emitting units are arranged; and the reference signal line overlaps at least one of the first power signal line or the data signal line in the direction perpendicular to the display panel.

8. The display panel according to claim 1, wherein the fingerprint identification module comprises a plurality of fingerprint identification units; the fingerprint identification unit comprises a photosensitive region; and the photosensitive region covers a corresponding first light-transmitting regions in the direction perpendicular to the display panel.

9. The display panel according to claim 8, wherein the fingerprint identification unit comprises a fingerprint identification sensor.

10. The display panel according to claim 9, wherein the fingerprint identification unit comprises a photosensitive diode for converting the light that reflected by the touch body into an electrical current signal.

11. The display panel according to claim 1, wherein the plurality of light-emitting units are configured to provide light for the fingerprint identification module; and the fingerprint identification module is configured to perform the fingerprint identification according to the light which firstly comes from the plurality of light-emitting units, is secondly reflected by the touch body, thirdly passes through the plurality of light-transmitting regions of the display module, and fourthly hits the fingerprint identification module.

12. The display panel according to claim 1, wherein the fingerprint identification module comprises the substrate, a plurality of fingerprint identification units disposed on the substrate, and at least one fingerprint identification light source disposed on one side of the substrate facing away from the plurality of fingerprint identification units, wherein the fingerprint identification light source is configured to emit light and enable the emitted light to hit the touch body by passing through a gap between two adjacent fingerprint identification units; and the fingerprint identification unit is configured to perform the fingerprint identification according to the light which firstly comes from the fingerprint identification light source, is secondly reflected by the touch body, thirdly passes through the plurality of light-transmitting regions of the display module and fourthly hits the fingerprint identification module.

13. The display panel according to claim 1, wherein the plurality of pixel driving circuits are in one-to-one correspondence with the plurality of light-emitting units.

14. The display panel according to claim 1, wherein the light-emitting units is an organic light-emitting element, and the reflecting electrode is an anode of the organic light-emitting element.

15. The display panel according to claim 1, wherein the reflecting electrode in the light-emitting unit electrically connected to the corresponding pixel driving circuit at the electrical potential connecting point is realized by a following manner:

the reflecting electrode in the light-emitting unit is electrically connected to the corresponding pixel driving circuit through a via hole, and a position of the via hole is a position of the electrical potential connecting point at which the reflecting electrode in the light-emitting unit is electrically connected to the corresponding pixel driving circuit.

16. The display panel according to claim 1, wherein the touch body is a finger or a palm of a hand.

17. The display panel according to claim 1, wherein the pixel driving circuit is a pixel driving circuit of 7T1C.

18. The display panel according to claim 1, wherein those of the pixel driving circuits corresponding to the light-emitting units are disposed in two adjacent rows and two adjacent columns and share one reference signal line, and wherein the two adjacent rows and two adjacent columns are connected to the reference signal line with displacement that the reference signal line forms a plurality of oblique lines.

19. A display device, comprising a display panel, wherein the display panel comprises:

a display module comprising an array substrate and a plurality of light-emitting units disposed on the array substrate, wherein each of the light-emitting units comprises a reflecting electrode, the reflecting electrode having a reflectivity to light, the array substrate comprises a plurality of pixel driving circuits, the reflecting electrode in the light-emitting unit is electrically connected to a corresponding pixel driving circuit at an electrical potential connecting point, and the display module comprises a plurality of light-transmitting regions disposed on the array substrate; and a fingerprint identification module disposed on one side of the array substrate facing away from the plurality of light-emitting units, the fingerprint identification module comprising a substrate, wherein the substrate comprises a top side and a bottom side, the fingerprint identification module is on the top side and the plurality of light-emitting units are on the bottom side, and the fingerprint identification module is configured to perform fingerprint identification according to light which is firstly reflected by a touch body, secondly passes through the plurality of light-transmitting regions of the display module, and thirdly hits the fingerprint identification module, wherein each of the plurality of light transmitting regions comprise (1) a plurality of large openings defining a plurality of first light-transmitting regions and (2) a plurality of small openings, such that the plurality of small openings each have an area which is less than 35% of an area of a largest of the plurality of large openings, wherein the first light-transmitting regions are formed adjacent to, when viewed from a direction perpendicular to the display panel, an electrical potential connecting point between the reflecting electrode and a corresponding pixel-driving circuit;

wherein an area of each of the plurality of first light-transmitting regions is greater than or equal to 2.5% of an area occupied by one pixel unit; and the area occupied by the one pixel unit includes a vertical projection, in the direction perpendicular to the display panel, of an area of the reflecting electrode and a vertical projection, in the direction perpendicular to the display panel, of an area of an area of transistors and capacitors in a corresponding pixel driving circuit, wherein the array substrate is provided with one scanning signal line and one light-emitting signal line which are corresponding to each row of light-emitting units, wherein groupings of six light-emitting units are arranged in three rows and two columns, wherein for each row, areas of two light-emitting units overlap in a first direction, and wherein for each column, areas of three light-emitting units overlap in a second direction orthogonal to the first direction, wherein those six pixel driving circuits corresponding to each grouping of six light-emitting units are arranged in two rows and three columns, and wherein distribution regions of the pixel driving circuits are spaced apart by a preset distance.

\* \* \* \* \*